United States Patent [19]

Bigall et al.

[11] Patent Number: 4,667,216

[45] Date of Patent: May 19, 1987

[54] ELECTRIC RESISTOR CONSISTING OF AT LEAST TWO MONOLITHICALLY COMBINED MIS-FIELD EFFECT TRANSISTORS FOR INTEGRATED SEMICONDUCTOR CIRCUITS

[75] Inventors: Klaus-Dieter Bigall, Vaterstetten; Heimbert Irmer, Haar, both of Fed. Rep. of Germany

[73] Assignee: Siemens Aktiengesellschaft, Berlin and Munich, Fed. Rep. of Germany

[21] Appl. No.: 834,653

[22] Filed: Feb. 27, 1986

Related U.S. Application Data

[63] Continuation of Ser. No. 630,334, Jul. 12, 1984, which is a continuation of Ser. No. 274,861, Jun. 18, 1981.

[30] Foreign Application Priority Data

Jul. 11, 1980 [DE] Fed. Rep. of Germany ....... 3026361

[51] Int. Cl.$^4$ ............................................. H01L 29/78
[52] U.S. Cl. ........................................ 357/41; 357/51; 357/23.1; 357/23.12; 307/304; 307/501; 307/264; 338/228 D
[58] Field of Search ................ 357/41, 51, 23.1, 23.12; 307/304, 501, 264; 338/225 D

[56] References Cited

U.S. PATENT DOCUMENTS

4,152,716  5/1979  Torii et al. ............................. 357/41
4,173,734 11/1979  Hirasawa et al. ...................... 357/42

FOREIGN PATENT DOCUMENTS

0009354  4/1980  European Pat. Off. ............ 307/304
2435606  2/1976  Fed. Rep. of Germany ...... 307/304
2025132  1/1980  United Kingdom .................. 357/51

Primary Examiner—Andrew J. James
Assistant Examiner—Jerome Jackson
Attorney, Agent, or Firm—Herbert L. Lerner; Laurence A. Greenberg

[57] ABSTRACT

Electric resistor, including at least two simultaneously produced monolithically combined MIS field-effect transistors for integrated circuits, each of the transistors having a source electrode and a drain electrode defining a source-drain path, a gate terminal and a channel width to channel length ratio, the transistors being connected in series with each other through the source-drain paths, each respective transistor having the gate terminal thereof connected to one of the source and drain electrodes thereof, and the transistors differ with respect to the channel width to channel length ratios thereof.

2 Claims, 4 Drawing Figures

ELECTRIC RESISTOR CONSISTING OF AT LEAST TWO MONOLITHICALLY COMBINED MIS-FIELD EFFECT TRANSISTORS FOR INTEGRATED SEMICONDUCTOR CIRCUITS

This application is a continuation of application Ser. No. 630,334, filed 7/12/84, which is a continuation of application Ser. No. 274,861 filed 6/18/81.

This invention relates to an electric resistor including at least two monolithically combined MIS field-effect transistors for integrated semiconductor circuits in which the field-effect transistors forming the resistor are produced simultaneously and are series-connected regarding their source-drain paths, and in which the gates of the field-effect transistors forming the resistor are connected either to the source or to the drain of the respective field-effect transistor. German Published, Prosecuted Application DE-AS No. 24 35 606 describes a monolithic circuit combination including two identical MOS field-effect transistors of the depletion type which meets this definition, and in which respectively adjacent transistors are combined in pairs by connecting the gate electrodes of both transistors to a common circuit point between the drain of one transistor and the source of the other transistor. Besides solving the problem posed in the German Publication DE-AS No. 24 35 606 of achieving an increase in the linear operating range as compared to a resistor—produced merely by an MOS field-effect transistor wired as a load resistance in the usual manner—it is another object of the transistor chain known from the German publication DE-AS No. 24 35 606 to indicate a solution of the problem of obtaining independence of the resistance value from the direction of current flow.

The solution of the problem of obtaining independence of the resistance value of the combination of series-connected MOS field-effect transistors forming the respective resistor as indicated in The German publication DE-AS No. 24 35 606 is not adequate in all cases, as experience has shown. This is especially the case whenever the substrate effect significantly affects the behavior of the participating field-effect transistors and the resistor requires more than only two series connected MOS field-effect transistors to obtain the resistance value needed for the particular case.

It is accordingly an object of the invention to provide an electric resistor having at least two monolithically combined MIS field-effect transistors for integrated semiconductor circuits, which overcomes the hereinafore-mentioned disadvantages of the heretofore known devices of this general type.

With the foregoing and other objects in view there is provided, in accordance with the invention, an electric resistor, comprising at least two simultaneously produced monolithically combined MIS field-effect transistors for integrated circuits, each of the transistors having a source electrode and a drain electrode defining a source-drain path, a gate terminal and a channel width to channel length ratio, the transistors being connected in series with each other through the source-drain paths, each respective transistor having the gate terminal thereof connected to one of the source and drain electrodes thereof, and the transistors differ with respect to the channel width to channel length ratios thereof.

In accordance with another feature of the invention, each respective transistor has the gate terminal thereof connected to the same corresponding one of the source and drain electrodes thereof, and each of the transistors differs with respect to the channel width to channel length ratios from every other transistor.

In accordance with a further feature of the invention, there are provided two resistor terminals, a given fixed potential $V_M$ being applied to one of the resistor terminals, a first voltage $(V_1 - V_M)$ and a second voltage $(V_M - V_2)$ being alternatively applicable to the resistor wherein $(V_1 - V_M) = -(V_2 - V_M)$, and the transistors being graded and balanced against each other with respect to the channel width to channel length ratios thereof for causing an equal and oppositely directed current to flow through the resistor when the first voltage is applied as compared to when the second voltage is applied.

In accordance with an added feature of the invention, the transistors are combined in pairs, each pair having the gate terminals of both transistors thereof being connected to the source electrode of one transistor and to the drain electrode of the other transistor of the pair, the transistors of each pair differing from each other only with respect to the channel width to channel length ratios thereof.

In accordance with an additional feature of the invention, the transistors of each pair are balanced against each other with respect to the channel width to channel length ratios thereof for causing the resistance value of each pair to become independent of the polarity of voltage applied thereto.

In accordance with yet another feature of the invention, each transistor differs with respect to the channel width to channel length ratios from every other transistor.

In accordance with yet a further feature of the invention, there are provided resistor terminals, the transistors being graded with respect to the channel width to channel length ration for causing the same amount of current to flow through the resistor when a first voltage is applied to the terminals as when an equal, inverted voltage is applied.

In accordance with a concomitant feature of the invention, the transistors are all of either the enhancement or depletion type.

The invention is realizable with transistors of the depletion type as well as with transistors of the enhancement type as mentioned above. However, when constructing a resistor according to the invention it will be expedient to use only MIS field-effect transistors identical with respect to their type.

This means that the field-effect transistors of the transistor chain forming the resistor, having been produced by identical manufacturing processes, differ only as far as their channel length L and their channel width W is concerned. Nevertheless, in order to influence the lateral dimensions of the current-carrying channel of the individual transistors in the sense of the invention, no different manufacturing steps are required, but only an appropriate construction of the area of the masks respectively assigned to the particular MIS field-effect transistor, needed in the various production steps for the complete circuit.

It is another object of the invention to match the resistors forming the resistor chain, such as according to the different embodiments shown in the drawings, with respect to their W:L ratio so that independence of the resistance value from the direction of current flow is assured even for a longer transistor chain.

Other features which are considered as characteristic for the invention are set forth in the appended claims.

Although the invention is illustrated and described herein as embodied in an electric resistor having at least two monolithically combined MIS field-effect transistors for integrated semi-conductor circuits, it is nevertheless but intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which.

MOS resistors are often required for analog circuits for which the greatest possible independence of the resistance value from the voltage applied to the resistor is desired. This applies, for example, to the output stage of a monolithically integrated audio frequency divider, such as can be used for electronic organs.

Figure 1:
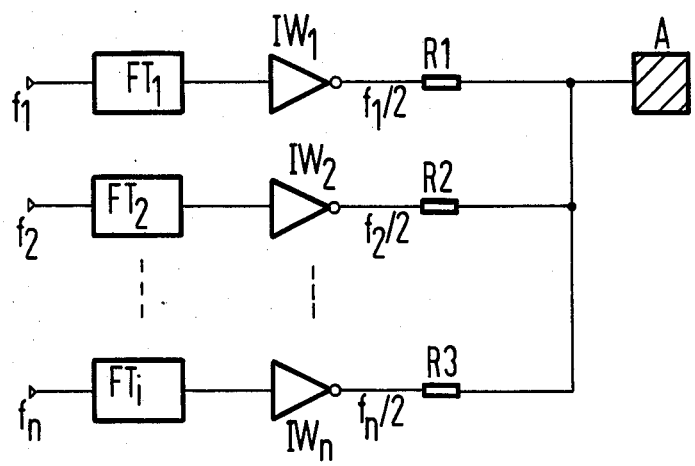
FIG. 1 is a diagrammatic and schematic circuit diagram for the resistor of the invention.

Referring now to the figures of the drawing and first particularly to FIG. 1, it is seen that electrical oscillations each representing one of the audio frequencies required are each applied to the output A of the audio frequency divider through one decoupling resistor R1, R2, R3, respectively, each set to a specific value. Regarding the frequencies themselves, $f_1/2$ is the frequency assigned to the resistor R1, $f_2/2$ is the frequency assigned to the resistor R2, etc., so that generally the frequency $f_\gamma/2$ is assigned to the resistor $R_\gamma$. The frequencies $f_\gamma/2$ ($\gamma = 1, 2, \ldots n$) are each furnished by a frequency divider $FT_\gamma$. The frequency dividers $FT_1$, $FT_2$ and $FT_n$ of the frequency divider $FT_\gamma$ are shown. The inputs $f_\gamma$ of the frequency dividers $FT_\gamma$ are jointly acted upon by an oscillator, and the frequency dividers are constructed in such a way that they transmit the respectively desired frequency $f_\gamma/2$ to the respectively associated impedance transformer $IW_\gamma$ which in turn transmits it to the respectively associated MOS resistor $R_\gamma$. The outputs of the MOS resistors $R_\gamma$ provided are jointly connected to the output A.

To obtain a sum voltage free of intermodulation at the output A, the signal amplitude at output A should be kept small through external circuitry. Moreover, the decoupling resistances $R_\gamma$, provided in the form of MOS resistors, should not change as a function of the H/L voltages made available by the respectively associated impedance transformer $IW_\gamma$. However, a change of the resistance value of the decoupling resistors comes about on principle due to the recognized substrate effect and is not avoidable offhand by the commonly applied means. Consequently, it is an object of the invention to compensate the influence of the substrate effect on the resistance value of a monolithically integrated resistor including MOS field-effect transistors (or more general, by MIS field-effect transistors). Furthermore, the problem of making the resistance value independent of the polarity of the voltage applied to the resistor is also solved thereby.

Figure 2:
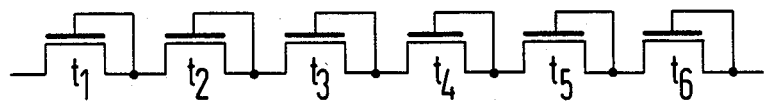
FIG. 2 is a schematic circuit diagram showing MOS transistors forming a resistor.

As may be seen from FIG. 2, the MOS transistors forming a resistor according to the invention can be series-connected so that the gate or base of the individual transistors $t_1, t_2, \ldots t_n$ (in the illustrated embodiment six transistors $t_1 - t_6$ are shown) is connected to the same current-carrying electrode of the transistor $t_i$ (i=number of the respective transistor in the chain). In this way, depending on the polarity of the voltage applied to the resistor, either the gate in each of the transistors $t_i$ is connected to the source, or the gate in each of the transistors $t_i$ is connected to the drain. On the basis of the definition of the invention as stated hereinafore, all of the transistors are either transistors of the enhancement type or all transistors of the depletion type.

Figure 3:
FIG. 3 is a view similar to FIG. 2 showing transistors connected in a different pattern.

However, the MOS field-effect transistors forming the resistor according to the invention can also be connected as shown in FIG. 3.

In the embodiment depicted in FIG. 3, two successive transistors $t_1$, $t_2$ or $t_3$, $t_4$ or $t_5$, $t_6$, respectively, are each combined so that their gate or base electrodes are connected to each other, and in addition to the interconnected current-carrying terminals of the two adjacent transistors. Accordingly, in one direction of the current flowing through this resistor as well as in the other direction of this current, the source terminal of half of the number of transistors provided and the drain terminals of the other half are connected to the associated gate.

When a resistor is constructed according to FIG. 2 of the invention, i.e. in a "serial" pattern, a continuous grading along the transistor chain regarding the W/L ratio can advantageously be applied. This possibility also exists for the anti-serial construction according to FIG. 3. In the FIG. 3 embodiment however, it is possible instead to merely match the transistor pairs belonging together in such a manner with respect to their W/L ratios that the resistance of each individual transistor pair already becomes independent of the current direction.

Figure 4:
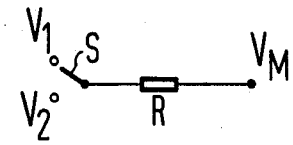
FIG. 4 is a diagrammatic view of a resistor to be used in the circuit.

In the presence of a resistor constructed of a chain of series-connected MOS field-effect transistors according to FIG. 2 or 3, the individual transistors must be so matched to each other regarding their W/L ratios that when this resistor R is used in a circuit according to FIG. 4, the following condition is met:

$$V_1 - V_M = -(V_2 - V_M). \tag{1}$$

One terminal of the resistor R is at a fixed potential $V_M$, whereas the other terminal is alternately switchable to a potential $V_1$ and a potential $V_2$ by a switch S. The potential $V_1$ may be defined, for instance, by the potential $V_{SS}$, and the potential $V_2$ by the operating potential $V_{DD}$ of the integrated semiconductor circuit containing the MOS resistor (or vice versa). Because of equation (1), the fixed potential $V_M$ is selected exactly in the middle between the two potentials $V_1$ and $V_2$. If the potential $V_1$ is then applied to the resistor R, the current $I_1 = (V_1 - V_M)/R$ results. On the other hand, if the potential $V_2$ is applied to the resistor R, the current $I_2 = (V_M - V_2)/R$ results, R designating the respective resistance value. If $I_1$ is to equal to $-I_2$, this can only be the case if the resistance value R is the same in both cases.

To determine the conditions required for this, reference is made to the circuit for the resistor R shown in FIG. 2.

Two different relations, derived as special cases from the known relation $$I_D = \beta \times ((U_{GS} - U_T) \times U_{DS} - U_{DS}^2/2) \tag{2}$$

where $$\beta = K'(W/L), \tag{3}$$

depending on the direction of the current flow, apply to the current $I_D$ flowing through the drain terminal of the individual transistor $t_i$. In these two equations (applying to unsaturated operation of the transistor $t_i$), $U_{GS}$ is the gate-source voltage, $U_T$ the threshold voltage, $U_{DS}$ the source-drain voltage, W the channel width and L the channel length, while K' is a constant which is the same for all transistors $t_i$ of the integrated MOS resistor and is dependent in a known manner upon the manufacturing conditions.

The threshold voltage $U_T$ depends on the operating direction because, among others, the substrate effect enters it also. It is, therefore, individually related to each one of the transistors $t_i$ and must be determined from case to case.

On the basis of the resistor R circuit shown in FIG. 4, there are two operating modes for the MOS transistors forming the resistor. In the first operating mode $U_{GS} = 0$, and in the second operating of mode $U_{GS} = U_{DS}$ Considering now the first transistor $t_1$ of the embodiment of the resistor R shown in FIG. 2, $$I_D(t_1; 1) = \beta \times (U_{DS} \times U_T(t_1; 1) + U_{DS}^2/2) \tag{4}$$

applies to the first operating mode on the basis of relation (2) and $$I_D(t_1; 2) = \beta \times ((U_{DS} - U_T(t_1; 2))U_{DS} - U_{DS}^2/2) \tag{5}$$

applies to the second operating mode, in which $V_T(t_1; 1)$ is the threshold voltage of the first transistor $t_1$ in the first operating mode and $U_T(t_1; 2)$ the threshold voltage of the first transistor $t_1$ in the second operating mode. $U_{DS}$ can be determined from the two equations (4) and (5) for the case where $$-I_D(t_1; 1) = I_D(t_1; 2) \tag{6}$$

and both threshold voltages are known. The two threshold voltages $U_T(t_1; 1)$ and $U_T(t_1; 2)$ can be calculated as functions of the substrate control voltage.

On page 57 of the book "MOS LSI Design and Application" by Carr and Mize (1972 edition) the relation $$U_T = \phi_{MS} \times (-Q_S/C_o) + 2\phi_F - \tag{7}$$

$$\sqrt{((2\epsilon_H \times q \times N(2\phi_F + V_B))} : C_o$$

is given for the threshold voltage $U_T$. Therein, $\phi_{MS}$ refers to the work function, $Q_S$ the charge density at the boundary between the semiconductor and the gate insulation, $\phi_F$ the Fermi level, $\epsilon_H$ the product of the relative dielectric constant of the semiconductor and the dielectric constant of the vacuum, q the elementary charge, N the doping concentration in the substrate, and $U_B$ the substrate control voltage between substrate and source of the respective transistor. $C_o$ is determined by the product of the (relative) dielectric constant of the gate insulation and the dielectric constant of vacuum divided by the thickness of the gate insulation.

The relation (7) can be converted to $$U_T = U_T(0) + F \times \sqrt{V_B + 2|\phi_F|} - \sqrt{2|\phi_F|}, \tag{7a}$$

in which $U_T(0)$ is the threshold voltage when $V_B = 0$, the equation for which is obtained from (7) by setting $U_B = 0$. The factor F is derived from $$F = \sqrt{2q \times \epsilon_H \times N} / C_o. \tag{7b}$$

By means of the last-mentioned relations (7) and (7a), (7b), respectively, the threshold voltages $U_T(t_1; 1)$ and $U_T(t_1; 2)$ for the first transistor $t_1$ of the chain can be determined on the basis of the potentials $V_1$ or $V_2$ or $V_M$ applied to the transistor chain according to FIG. 2 when used as the resistor R in the circuit according to FIG. 4, and $U_{DS}(t_1)$, ensuing from the relation (6) for the source-drain voltage $U_{DS}$ of the first transistor $t_1$, can be calculated.

The same observation can also be made for the other transistors $t_i$ of the chain, i.e. the transistors $t_2$, $t_3$, etc. For each transistor $t_i$ a $U_{DS}(t_i)$ value for the source-drain voltage is then obtained, to which $$I_D(t_i; 1) = I_D(t_i; 2) \tag{6}$$

applies.

What must still be taken into account is that the current $I_D(t_1)$ flowing in the transistor $t_1$ of the chain must be equal to the current $I_D(t_i)$ of each of the rest of the transistors $t_i$ of the chain.

With reference to the first operating mode, $$I_D(t_1) = \beta_1 \times (U_{DS}(t_1) \times U_T(t_1; 1) + U_{DS}^2(t_1)/2)$$

applies to the first transistor $t_1$ according to equation (4), or abbreviated $$I_D(t_1) = \beta_1 \times f(U_{DS}(t_1)). \tag{a}$$

Analogously, the relation for the second transistor $t_2$ of the chain is $$I_D(t_2) = \beta_2 \times f(U_{DS}(t_2)), \tag{b}$$

and generally for the $i^{th}$ transistor $t_i$ of the chain $$I_D(t_i) = \beta_i \times F(U_{DS}(t_i)). \tag{c}$$

Taking, for example, the current $I(t_1)$ through the first transistor $t_1$ as a reference value, it is possible to calculate from the two relations (a) and (c) the value for $\beta_i$, to which $$I_D(t_i) = I_D(t_1) \text{ applies.} \tag{8}$$

According to the equation $$\beta_i = \beta_1 \times f(U_{DS}(t_1)) : f(U_{DS}(t_i)), \tag{9}$$

this value is obtained for $i = 2, 3, \ldots$

Instead of the relation (4) for the first operating mode, it is obvious that the relation (5) for the second operating mode could also have been used to derive the relation (9).

According to equation (3), the corresponding value of W/L follows from each one of the $\beta_i$ values (i = 1, 2, ...) found. The corresponding Wi/Li values are graded in accordance with the numbering i of the transistors $t_i$ in the chain according to FIG. 2 so that when using the transistor chain as a resistor R in the circuit according to FIG. 4, the current in one position of switch S becomes opposite and equal to the current in the other position of switch S.

The voltage $V_1 - V_M$ and $V_M - V_2$, respectively, to be applied to the two ends of the chain is derived as the sum of all voltages $U_{SD}(t_i)$, i.e. according to $$V_1 - V_M = -(V_2 - V_M) = \sum_{i=1}^{n} U_{DS}(t_i) \qquad (10)$$

in which n is the number of transistors $t_i$ provided.

The specified current $I_D = I'_D$ numerically determines the W-relationship.

In the case of a circuit according to FIG. 3 it suffices to match the transistor pairs $t_1$, $t_2$; $t_3$, $t_4$; $t_5$, $t_6$, respectively, defined in such a way that their gates are combined to each other with respect to the two transistors forming the respective pair so that the (W/L) values within the individual pairs differ while the odd-numbered transistors $t_i$ of the chain have the same first value of the W/L ratio and the even-numbered transistors $t_i$ have the same second value of the W/L ratio. The transistor pair is then determined in accordance with the above explanations, for the values found for i = 1, ...

From the equations (4), (a), (9) and (3), it follows that:

$W_i/L_i = (1/K') \cdot \beta_1 \cdot f(U_{DS}(t_1))/f(U_{DS}(t_i))$ $W_i/L_i = (1/K') \cdot \beta_1 \cdot (U_{DS}(t_1) \cdot U_T(t_1; U_{GS}=0) + U^2_{DS}(t_1)/2)/(U_{DS}(t_1) \cdot U_T(t_i; U_{GS}=0) + U^2_{DS}(t_i)/2)$ from which the corresponding values for $W_i/L_i$ are found where in the respective current equations the connection of the transistors $t_i$ forming the first pair $t_1$ and $t_2$ must be taken into consideration. This is done using the relations (4) and (5).

The other transistor pairs $t_3$, $t_4$, etc. are also determined by the above-described method. If geometrically identical transistor pairs are to be used only (for the circuit according to FIG. 3), the W/L ratios must be successively calculated in analogous way to the method described above with reference to FIG. 2—but applying an iteration method.

The compensation method described above is applicable exactly to (1) given voltages $(V_1 - V_M)$ or $(V_m - V_2)$ and to
(2) a defined substrate control factor F (see (7b)) only. If the substrate control factor varies, this would therefore make an exact compensation impossible.
(3) In addition, it is essential for the successful application of the compensating method that the MOS transistors forming part of the resistor R be equipped with a common substrate terminal.

Resistors R formed of one transistor chain according to FIG. 2 or 3 each are excellently suited for use in the circuit shown in FIG. 1, as long as the (W/L) ratios of the transistors succeeding each other in the chain are graded so that the influence of the substrate effect upon the behavior of these resistors is compensated in the manner described.

There are claimed:

1. Electric resistor, comprising at least two simultaneously produced monolithically combined MIS field-effect transistors for integrated circuits, each of said transistors having a source electrode and a drain electrode defining a source-drain path, a gate terminal and a channel width-to-channel length ratio, said transistors being connected in series with each other through said source-drain paths, each of said transistors, respectively, having the gate terminal thereof connected to one of the source and drain electrodes thereof, said transistors being different from each other with respect to the channel width to channel length ratios thereof and being chained and mutually adjusted in a manner that, under a condition:

$$(V_1 - V_M) = -(V_2 - V_M) = \sum_{i=1}^{n} U_{DS}(t_i),$$

wherein $V_M$ is a fixed potential at one terminal of the resistor,
$V_1$ and $V_2$ are potentials alternatingly applied to the other terminal of the resistor,
$U_{DS}(t_i)$ is the drain source voltage of the ith transistor, the appertaining channel width-to-channel length ratio (Wi/Li) is defined as follows:

$$W_i/L_i = \frac{1}{K'} \beta_1 \cdot f(U_{DS}(t_1)) : f(U_{DS}(t_i))) = \frac{1}{K'} \cdot \beta_1 \cdot \frac{(U_{DS}(t_1) \cdot U_T(t_1; U_{GS}=0) + U^2_{DS}(t_1)/2)}{(U_{DS}(t_i) \cdot U_T(t_i; U_{GS}=0) + U^2_{DS}(t_i)/2)}$$

wherein
K' is a constant dependent conventionally upon manufacturing conditions, $\beta_1 = K' \cdot (W_1/L_1)$ wherein $(W_1/L_1)$ is the ratio of a given channel width to a given channel length, and
$V_T(t_1; V_{GS}=0)$ is the threshold voltage for a given transistor in a first operating mode wherein the gate-source voltage is equal to zero.

2. Electric resistor according to claim 1 wherein a multiplicity of said transistors are monolithically combined in a chain of pairs thereof, each pair of said transistors having the gate terminals thereof both connected to the source electrode of one transistor of said pair and to the drain electrode of the other transistor of said pair, the transistors of each of said pairs differing from each other only with respect to the channel width-to-the channel length ratios thereof and, starting with a first transistor of said chain, all of the odd-numbered transistors in said chain having the same first channel width-to-channel length ratio, and all of the even-numbered transistors in said chain having the same second channel width-to-channel length ratio.

* * * * *